United States Patent [19]

Yamashita et al.

[11] Patent Number: 4,903,103
[45] Date of Patent: Feb. 20, 1990

[54] SEMICONDUCTOR PHOTODIODE DEVICE

[75] Inventors: Tomitaka Yamashita; Mikio Kyomasu, both of Shizuoka, Japan

[73] Assignee: Hamamatsu Photonics Kabushiki Kaisha, Shizuoka, Japan

[21] Appl. No.: 263,203

[22] Filed: Oct. 27, 1988

[30] Foreign Application Priority Data

Oct. 30, 1987 [JP] Japan .................................. 62-274864

[51] Int. Cl.⁴ ............................................ H01L 27/14
[52] U.S. Cl. ........................................ 357/30; 357/17;
357/20; 357/48; 357/49; 357/52; 357/55;
357/84
[58] Field of Search ........................ 357/17, 20, 30, 48,
357/49, 52, 55, 84

[56] References Cited

U.S. PATENT DOCUMENTS 4,606,115  8/1986  Kervin et al. ..................... 357/30

Primary Examiner—Edward J. Wojciechowicz
Attorney, Agent, or Firm—Finnegan, Henderson, Farabow, Garrett and Dunner

[57] ABSTRACT

A semiconductor photodiode device comprises a substrate with top and bottom opposite surfaces, having an upper portion of a first conductivity type adjacent the top surface and a lower portion of a second conductivity type adjacent the bottom surface, an anode region of the second conductivity type and a cathode region of the first conductivity type radially spaced from the anode region and disposed in the top surface of the substrate, and an isolation region of the second conductivity type disposed in the upper portion of the substrate radially spaced from the surrounding the cathode and anode regions. The isolation region extends to the lower portion of the substrate. A buried region of the first conductivity type underlies a portion of the top surface of the substrate enclosed by the cathode region and spaced from the anode, cathode and isolation regions such that the buried region is in contact with the upper and lower portions of the substrate. A sidewall region of the first conductivity type in the upper portion of the substrate is disposed between and spaced from the isolation region and the anode region and connects the buried region to the cathode region for eliminating parasitic effects. A light-shield film covers a portion of the top surface of the substrate overlaying and extending between the cathode region and the isolatioin region for preventing light from striking the covered portion of the substrate.

3 Claims, 5 Drawing Sheets

SEMICONDUCTOR PHOTODIODE DEVICE

BACKGROUND OF THE INVENTION

1. Field of the Invention

This invention relates to a semiconductor device in which a plurality of photodiodes are formed in the substrate.

1. Description of the Prior Art

FIG. 4 shows such a semiconductor device of the prior art. In this device, an n-type epitaxial growth layer 2 is formed on a p-type substrate 1, thereby forming a semiconductor substrate structure 10. An $n^+$-type buried region 3 is formed in the middle of the boundary between substrate 1 and epitaxial growth layer 2. A p-type anode region 5 is formed on the surface of epitaxial growth layer 2, by ion implanting or diffusion process, and $n^+$-type cathode regions 6 formed on the same surface, surrounding the anode region and being spaced therefrom at a predetermined distance. A photodiode is now formed, comprising p-type anode and n-type cathode regions. Furthermore, as shown in FIG. 5($a$), an anode electrode 15 is provided in anode region 5, cathode electrodes 16 in cathode regions 6, and a substrate electrode 11 on the bottom surface of substrate 1, being connected to ground potential, to complete the photodiode. A plurality of $p^+$-type isolation regions 4 are formed in epitaxial growth layer 2 to isolate each photodiode from one another.

When light rays are incident on the photodiode as shown in FIG. 5($a$), electron-hole pairs are generated in the vicinity of the p-n junction of the photodiode. If a zero or reverse bias voltage is applied across the p-n junction, the holes of the generated electron-hole pairs will drift, across the depletion region formed close to anode region 5, so that a photocurrent flows across the photodiode, thus transforming an optical input to an electrical signal.

In the semiconductor photodiode device of the structure of FIG. 4, a photodiode $D_1$ is formed by anode and cathode regions 5 and 6 close to isolation regions 4 and since isolation region 4 is $p^+$type, a parasitic photodiode $D_2$ is formed, as indicated by a dashed line, as shown in FIG. 5($a$) FIG. 5($b$) shows an equivalent circuit schematic comprising the photodiode and the parasitic diode. Designating $I_1$ being the current flowing into the device, $I_{PD1}$, the photocurrent of photodiode $D_1$, and $I_{PD2}$ the photocurrent of parasitic photodiode $D_2$, it can be obtained that:

$$I_1 = 165.7 \ (\mu A)$$

$$I_{PD1} = 93.9 \ (\mu A) \text{ and}$$

$$I_{PD2} = 70.6 \ (\mu A)$$

Then, it may be established that:
$$I_1 \approx I_{PD1} + I_{PD2}$$

For photodiode $D_1$, photodiode $D_2$ is nothing less than a parasitic diode. Photocurrent $I_{PD2}$ of parasitic photodiode $D_2$ depends on several factors including the wave length of irradiated light rays, the lot to lot variance in quality in the manufactured semiconductor substrate, and the bias voltage applied to the device. Photocurrent $I_{PD1}$ in the n-type side of photodiode $D_1$ inherently includes the effect of the parasitic element. This effect of the parasitic element degrades the design accuracy of the device. For example, the presence of parasitic photodiode $D_2$ facilitates the holes generated in the lower portion of cathode regions 6 to drift toward isolation region 4, the extent of which increases as the reverse bias voltage increases, thus reducing the p-type side of photo current $I_{PD1}$ of photodiode $D_1$.

When photodiode $D_1$ is forward-biased, a p-n-p type parasitic transistor is formed with the emitter of the parasitic transistor disposed in anode region 5 of diode $D_1$, the base in cathode regions 6, and the collector in isolation regions 4. Then, the current flows from anode region 5 to isolation regions 4 and substrate 1, thus causing the substrate potential to rise. This rise of the substrate potential adversely affects the performance of the external circuit (not shown), connected to the device via isolation regions 4 in the photodiode.

The problem becomes more severe as photodiode $D_1$ is disposed closer to isolation regions 4 to increase the circuit packaging density. A simple measure to solve the problem is to separate photodiode 5 from isolation regions 4 at a sufficient distance. However, this measure increases the occupying area for the element in the device, adversely affecting the circuit packaging density, particularly important when the circuit is fabricated into an integrated circuit device. Furthermore, this measure does not completely eliminate the problem associated with the parasitic element.

SUMMARY OF THE INVENTION

One object of the present invention is to overcome the problems and disadvantages of the prior art.

Another object of this invention is to provide a semiconductor photodiode device which reduces the effect of the parasitic element to a minimum while allowing a high packaging density.

The present invention is to provide a semi-conductor photodiode device which contains therein, anode and cathode regions, the anode region being of a second conductivity type and formed in the semiconductor substrate of a first conductivity type. The cathode region is of a first conductivity type and formed in the same substrate, surrounding the anode region, but physically separated therefrom at a predetermined distance. The device also contains sidewall regions of the first conductivity type, disposed in the semiconductor substrate of the first conductivity type and connecting the cathode region to buried region of the first conductivity type. The buried layer is underlaid below the areal portion of the semiconductor device enclosed by the cathode region. The sidewall regions are extended deep enough to allow the depletion region of the sidewall region to reach the buried region.

According to the present invention, when the photodiode is reverse biased and the depletion region formed close to the isolation region expands, the carriers generated in the photodiode will not significantly be affected by the expansion of the depletion region. When the photodiode is forward-biased, the carriers will still not be significantly affected by the parasitic transistor.

Another aspect of the present invention includes a light-shield film, which covers the areal portion of the semiconductor device not used as the light receiving portion of the photodiode, to prevent the incident light rays from generating electron-hole pairs outside the photodiode.

The accompanying drawings, which are incorporated in and constitute a part of this specification, illustrate several embodiments of the invention and together with the description, serve to explain the principles of the invention.

DESCRIPTION OF THE PREFERRED EMBODIMENT

Reference will now be made in detail to the present preferred embodiments of the invention, examples of which are illustrated in the accompanying drawings. Wherever appropriate, the same reference numbers will be used throughout the drawings to refer to the same or like parts.

Figure 1A:
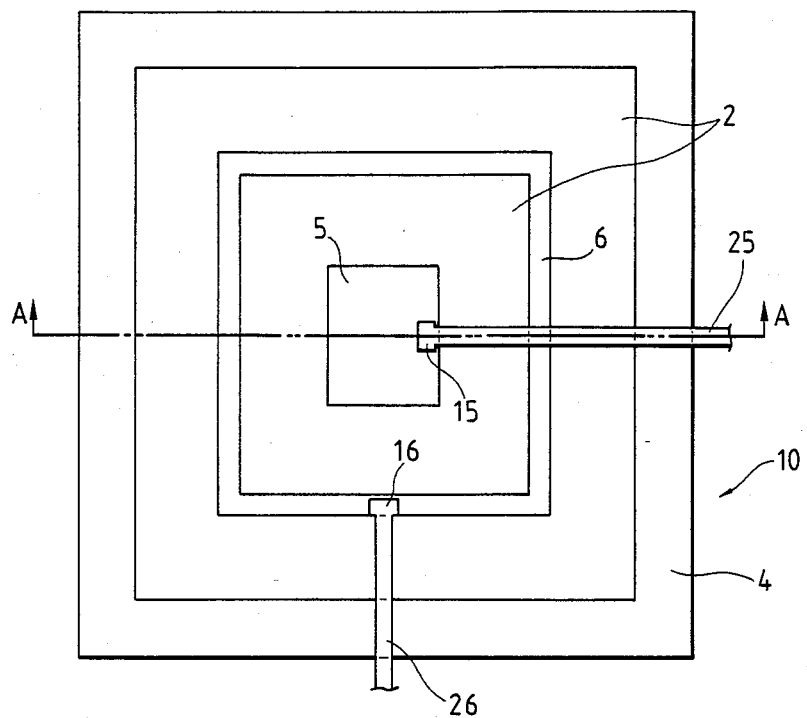
FIG. 1(a) shows a plan view of the structure of a semiconductor photodiode device according to a first embodiment of the present invention.
Figure 1B:
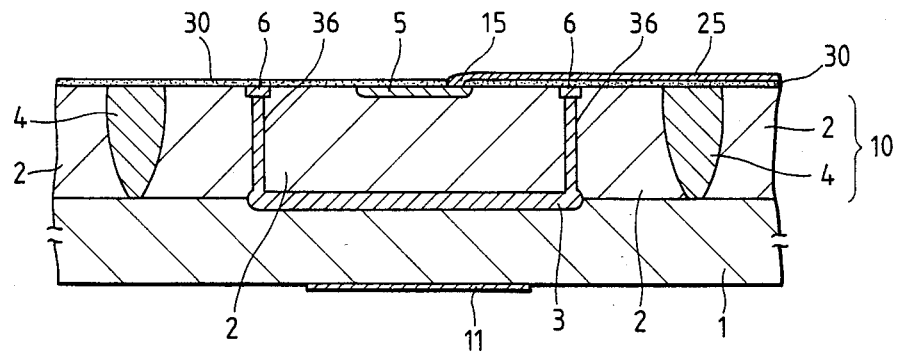
FIG. 1 (b) shows an elongated fragmentary cross-sectional view of a semiconductor device for illustrating the semiconductor photodiode device of FIG. 1(a).
Figure 4:
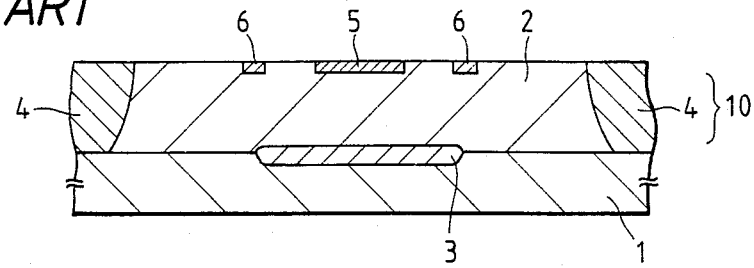
FIG. 4 shows a cross-sectional view of a semiconductor device of the prior art.
Figure 5A:
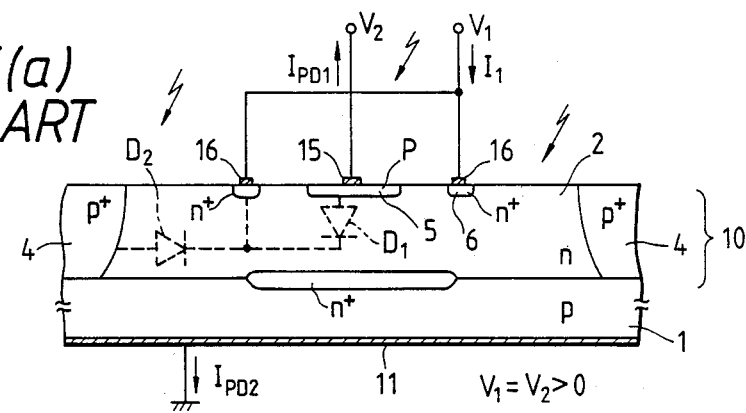
FIG. 5(a) shows an equivalent circuit schematic of the device of FIG. 4, including the parasitic element.
Figure 5B:
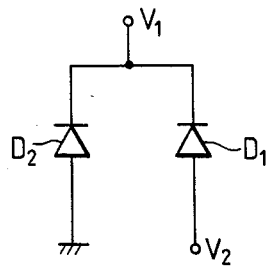
FIG. 5(b) shows an equivalent circuit schematics for the photodiode and parasitic diode of the semiconductor photodiode device of FIG. 5(a).

FIG. 1 shows a structure of the semiconductor device according to the first embodiment of this invention. FIG. 1(a) shows a plan view of the structure of the semiconductor device and FIG. 1(b) a cross-sectional view taken along line A—A in FIG. 1(a). The major difference between the device of the present invention as shown in FIG. 1 and the prior art shown in FIG. 4 is that the present invention includes $n^+$-type sidewall regions 6, connecting $n^+$-type cathode regions 6 to $n^+$-type buried region 3, and completely surrounding p-type anode region 5. Anode region 5 is now completely isolated from isolation regions 4 as shown in FIG. 1(b). Anode electrode 15 is formed in an opening of an insulating film 30 and connected to the external circuit (not shown) by an interconnection wire 25. Insulating film 30 is made of a material such as $SiO_2$ and interconnection wire 25 of a material such as aluminum. Cathode electrode 16 is connected to the external circuit by interconnection wire 26, as shown in FIG. 1(a).

The operation of the device according to the first embodiment of this invention is described as follows.

Assuming that anode region 5 and cathode region 6 are reverse-biased, then, electron-hole pairs are generated, and the holes flow into p-type anode region 5, when light rays are incident on the semiconductor device. Since a region adjacent anode region 5 in the photodiode is now completely enclosed by $n^+$-type buried region 3 and sidewall regions 36, even if the depletion region formed close to p-type isolation region 4 expands due to the reverse bias, the holes generated will not be affected by the expansion. Therefore, the photocurrent in the p-type side of the photodiode will not be reduced.

Similarly, assuming that anode region 5 and cathode region 6 are forward-biased, the parasitic p-n-p transistor will not function because the collector of the parasitic transistor disposed in isolation regions 4 is now completely isolated from the base in cathode regions 6 and the emitter in anode regions. This successfully solves the problem of the rise of the substrate potential and its adverse effect on the eternal circuit.

Figure 2A:
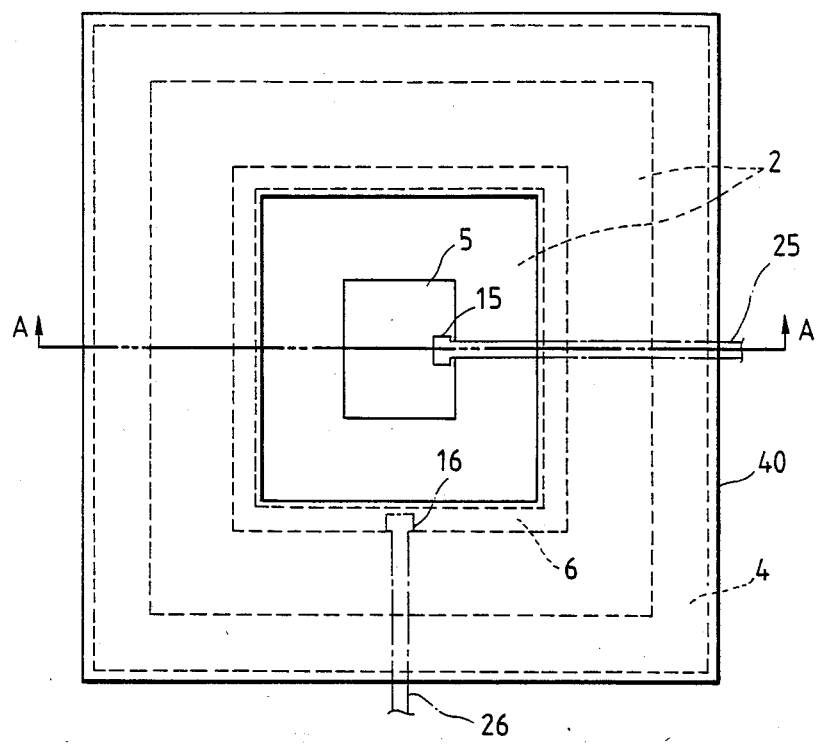
FIG. 2(a) shows a plan view of the structure of a semiconductor device according to a second embodiment of the present invention.
Figure 3A:
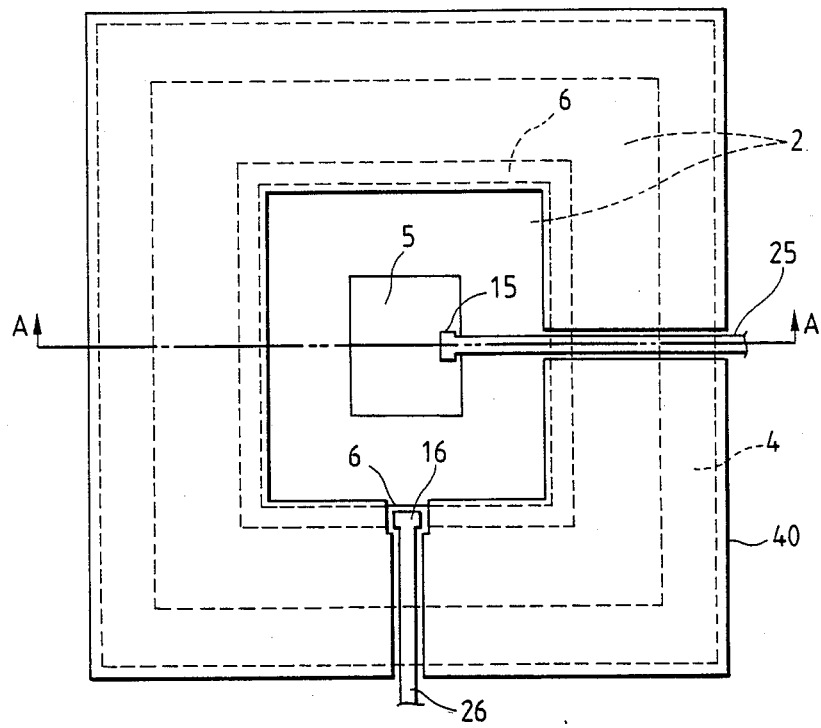
FIG. 3(a) shows a plan view of the structure of a semiconductor device according to a third embodiment of the present invention.
Figure 3B:
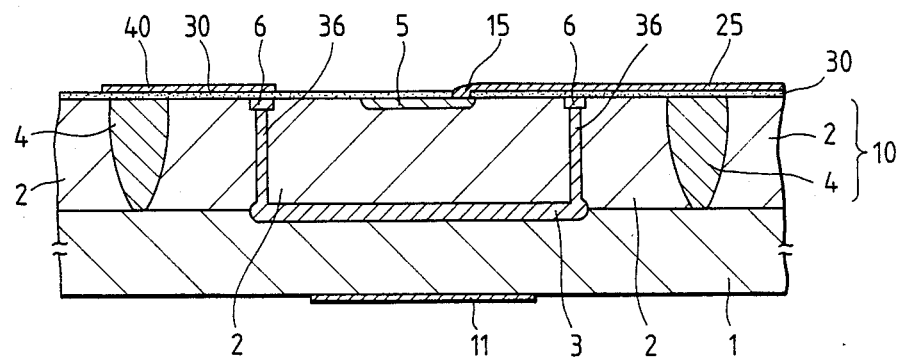
FIG. 3(b) shows an elongated fragmentary cross-sectional view of a semiconductor device illustrating the semiconductor photodiode device of FIG. 3(a).

The second and third embodiments of the present invention are described in FIGS. 2(a)- and 2(b), and FIGS. 3(a) and 3(b).

Figure 2B:
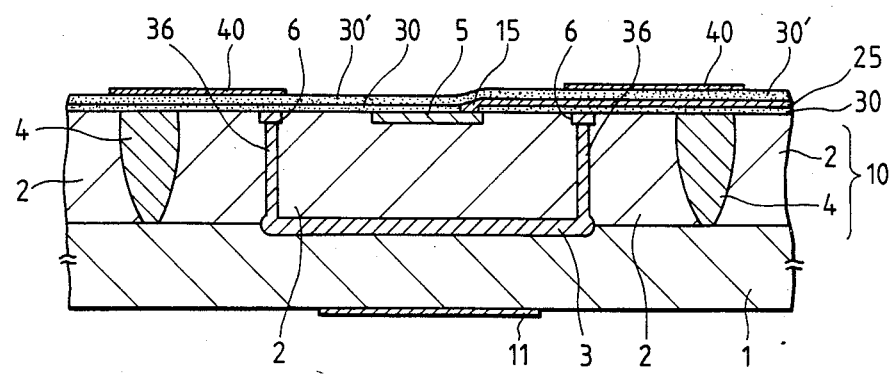
FIG. 2(b) shows an elongated fragmentary cross-sectional view of a semiconductor device for illustrating the semiconductor photodiode device of FIG. 2(a).

The second embodiment employs a light-shield film 40 covering the areal portion of the photodiode extending between cathode regions 6 and isolation region 4 of the photodiode, as shown in FIGS. 2(a) and 2(b). FIG. 2(a) shows a plan view of a structure of the photodiode according to the second embodiment and FIG. 2(b) an elongated fragmentary cross-sectional view of a semiconductor device for illustrating the photodiode device of FIG. 2(a) taken along line A—A. The major difference between the second and first embodiments is that the photodiode device according to the second embodiment has an additional light-shield film 40, laid over a second insulating film 30'. Second insulating film 30' covers anode electrode 15 and interconnection wire 25. As shown in FIG. 2(b), light shield film 40 covers and shields from light rays the areal portion of the photodiode extending between $n^+$-type cathode regions 6 and $p^+$-type isolation region 4. A material such as aluminum is deposited by a process such as chemical vapor deposition (CVD), to form light-shield film 40.

FIG. 3(a) and 3(b) show the third embodiment of the present invention. FIG. 3(a) shows a plan view of the structure of a semiconductor photodiode device according to the third embodiment and FIG. 3(b) an elongated fragmented cross-sectional view of a semiconductor device for illustrating the photodiode of FIG. 3(a), taken along line A—A. The difference between the second and third embodiments is that light-shield film 40 employed in the third embodiment is patterned, processed by using a mask, whereby interconnection wires 25 and 26 are physically separated from light-shield film at a predetermined distance to ensure an electrical isolation from one another. The extent of the coverage by the light-shield film in the embodiment is substantially the same as that in the second embodiment.

The operation of the semiconductor device according to the second and third embodiments is described as follows.

In the second and third embodiment, of the present invention, electron-hole pairs are never generated in the areal portion of the photodiode covered by the light-shield film, thus resulting in, little, if any, presence of photocurrent $I_{PD2}$ at electrode 11. Moreover, in the second and third embodiments, as in first embodiment, sidewall regions 36 are also provided, thus further eliminating the effect of the parasitic element in the photodiode.

According to the present invention, the semiconductor photodiode device can be applicable to the following two situations, for example.

Firstly, this invention eliminates the effect of the parasitic element in the photodiode device. The photocurrent of the photodiode is directly proportional to its light receiving area. Therefore, the photocurrent of several photodiodes of the same structure and area can be compared. For example, when the effect of the parasitic photo diode is not negligible and must be accounted for, the photo current in the n-type side of a first sample photodiode for comparison could not be compared with that in the p-type side of a second sample photodiode, because the first photodiode may have been adversely influenced by the parasitic element to a different extent than the second photodiode. To the contrary, with this invention, because the adverse effect of the parasitic element is eliminated, the photocurrent in the n-type side of the photodiode will be equal to that in the p-type side. Thus, the photocurrent in the p-type side of the first photodiode can be compared with that in the n-type side of the second photodiode.

Figure 6:
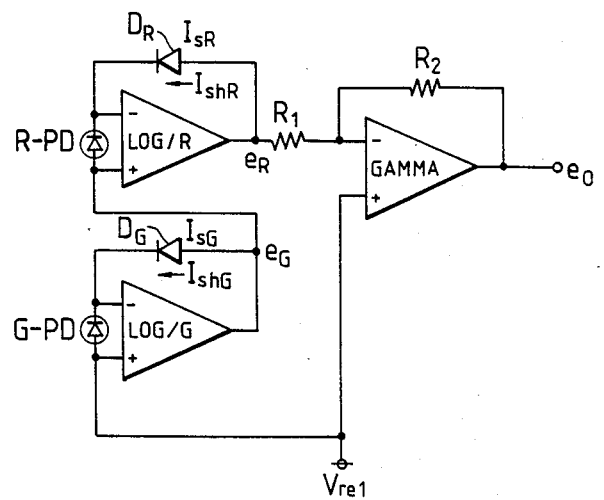
FIG. 6 shows a schematic block diagram of a color difference signal output circuit for an integrated circuit type color sensor to which the semiconductor photodiode devices of the present invention are applied.

Secondly, assuming that the anode and cathode electrodes of a plurality of photodiodes are connected to the inverting and noninverting input terminals, respectively, of corresponding operational amplifiers in a color difference signal output circuit for a color sensor in a manner as shown in FIG. 6, in an ideal situation where no voltage appears at the amplifier input, the photodiode will have zero bias voltage. However, in reality, a voltage appears at the amplifier input, due to an offset voltage existing at the input, and the photodiode is forward-biased by the offset voltage. Then, there is a possibility, although it is rare, that the parasitic transistor may function. Even in this situation, the parasitic transistor in the photodiode of the present invention will not function because, regardless of the voltage presence at the amplifier input, the collector current of the parasitic transistor, according to the present invention, will be blocked from flowing into the substrate, thus not adversely effecting the performance of the adjacent semiconductor circuit.

In summary, according to this invention, when the photodiode is reverse biased and as a result the depletion region formed close to the isolation region expands, the carriers generated in the photodiode region will not be affected by the expansion of the depletion layer. Similarly, when the photodiode is forward-biased, the parasitic transistor present in the photodiode will not function. Thus, the present invention eliminates the effect of the parasitic element, while allowing a high circuit packaging density for integrated circuit fabrication.

Additional provision of the light-shield film prevents the generation of electron-hole pairs outside the areal portion of the photodiode enclosed by the cathode region in the device and consequently the photocurrent in the parasitic element formed in connection with the isolation region.

It will be apparent to those skilled in the art that various modifications and variations can be made in the semiconductor device of the present invention and in construction of this semiconductor device without departing from the scope or spirit of the invention. As an example, the conductivity type of the respective regions may be reversed. The substrate structure is not limited to the substrate with an epitaxial growth layer. The connection of sidewall region 36 to buried region 3 is not essential. Any sidewall region as long as their depletion region reaches the buried region, will provide the beneficial effect comparable to that attained by the aforementioned embodiments.

What is claimed is:

1. A semiconductor photodiode device comprising:
   a substrate with top and bottom opposite surfaces, having an upper portion of a first conductivity type adjacent the top surface and a lower portion of a second conductivity type adjacent the bottom surface;
   an anode region of the second conductivity type and a cathode region of the first conductivity type radially spaced from the anode region and disposed in the top surface of the substrate;
   an isolation region of the second conductivity type disposed in the upper portion of the substrate radially spaced from and surrounding the cathode and anode regions, said isolation region extending to the lower portion of the substrate;
   a buried region of the first conductivity type underlying a portion of the top surface of the substrate enclosed by the cathode region and spaced from the anode, cathode and isolation regions, said buried region being in contact with the upper and lower portions of the substrate;
   a sidewall region of the first conductivity type in the upper portion of the substrate disposed between and spaced from the isolation region and the anode region and connecting the buried region to the cathode region for eliminating parasitic effects; and
   a light-shield film covering a portion of the top surface of the substrate overlaying and extending between the cathode region and the isolation region for preventing light from striking the covered portion of the substrate.

2. A semiconductor photodiode device according to claim 1, wherein the upper portion of the substrate is formed by an epitaxial growth layer of the first conductivity type.

3. A semiconductor photodiode device according to claim 1, further comprising interconnection wires disposed in the top surface of the substrate and extended from the anode and cathode regions, wherein said light-shield film terminates adjacent to but spaced from said interconnection wires for electrically isolating said interconnect wires from said light-shield film.

* * * * *